United States Patent
Chuang et al.

(10) Patent No.: US 6,821,913 B2
(45) Date of Patent: Nov. 23, 2004

(54) METHOD FOR FORMING DUAL OXIDE LAYERS AT BOTTOM OF TRENCH

(75) Inventors: Chiao-Shun Chuang, Kaohsiung (TW); Chien-Ping Chang, Hsinchu (TW); Mao-Song Tseng, Hsinchu (TW); Cheng-Tsung Ni, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 303 days.

(21) Appl. No.: 10/232,260

(22) Filed: Aug. 29, 2002

(65) Prior Publication Data

US 2003/0068901 A1 Apr. 10, 2003

(30) Foreign Application Priority Data

Oct. 4, 2001 (TW) .......................................... 90124497 A

(51) Int. Cl.⁷ .............................................. H01L 21/31
(52) U.S. Cl. ....................... 438/786; 438/424; 438/435; 438/756; 438/757
(58) Field of Search .................. 438/786, 424, 438/435, 756, 757, 437, 700, 430

(56) References Cited

U.S. PATENT DOCUMENTS 6,709,952 B2 * 3/2004 Lai et al. ..................... 438/424
6,764,810 B2 * 7/2004 Ma et al. ..................... 430/313

* cited by examiner

*Primary Examiner*—Matthew Smith
*Assistant Examiner*—Igwe U. Anya
(74) *Attorney, Agent, or Firm*—Townsend and Townsend and Crew LLP

(57) ABSTRACT

Embodiments of the present invention are directed to an improved method for forming dual oxide layers at the bottom of a trench of a substrate. A substrate has a trench which includes a bottom and a sidewall. The trench may be created by forming a mask oxide layer on the substrate; defining the mask oxide layer to form a patterned mask oxide layer and exposing a partial surface of the substrate to form a window; and using the patterned mask oxide layer as an etching mask to form the trench in the window. A first oxide layer is formed on the sidewall and the bottom of the trench of the substrate. A photoresist layer is formed on the substrate, filling the trench of the substrate. The method further comprises partially etching back the photoresist layer to leave a remaining photoresist layer in the trench. The height of the remaining photoresist layer is lower than the depth of the trench. A curing treatment of the remaining photoresist layer is performed after the partial etching. The patterned mask oxide layer and a portion of the first oxide layer are removed to leave a remaining first oxide layer at the bottom of the trench. The remaining photoresist layer is removed. A second oxide layer is formed on the substrate covering at least the remaining first oxide layer to form the dual oxide layers at the bottom of the trench.

20 Claims, 12 Drawing Sheets

METHOD FOR FORMING DUAL OXIDE LAYERS AT BOTTOM OF TRENCH

CROSS-REFERENCES TO RELATED APPLICATIONS

This application claims priority from R.O.C. Patent Application No. 090124497, filed Oct. 4, 2001, the entire disclosure of which is incorporated herein by reference.

BACKGROUND OF THE INVENTION

The present invention relates generally to semiconductor manufacturing and, more particularly, to an improved method for forming dual oxide layers at the bottom of a trench of a substrate.

To achieve an increase in integration and smaller ICs (integrated circuits), the DMOS (Double Diffused Metal Oxide Semiconductor) is commonly used in semiconductor manufacturing. The manufacturing of DMOS requires the formation of an oxide layer, called bottom oxide layer, at the bottom of a trench to reduce the charge produced from turning on the DMOS and to decrease the leakage current.

The conventional procedure for forming dual oxide layers at the bottom of a trench is described as follows. Referring to FIG. 1a, a semiconductive substrate 100 having a trench 110 and a mask layer 120 is provided.

Referring to FIG. 1b, an oxide layer 130 is formed on the sidewall and the bottom of trench 110. The oxide layer 130 is a self-aligned contact oxide layer formed by thermal oxidation.

Referring to FIG. 1c, a HMDS (hexamethyl disilazane) coating treatment 140 is performed. The HMDS coating treatment 140 is used as a priming treatment before coating photoresist.

Referring to FIG. 1d, a photoresist layer 150 is deposited on the mask layer 120, and the trench 110 is filled up with the photoresist layer 150.

Referring to FIG. 1e, a curing treatment 160 is performed to cure the photoresist layer 150.

Referring to FIG. 1f, the photoresist layer 150 is partially etched to leave a remaining photoresist layer 150', wherein the thickness of the remaining photoresist layer 150' is lower than the depth of trench 110.

Referring to FIG. 1g, the mask layer 120 and part of the oxide layer 130 are removed by BOE (buffered oxide etchant) treatment, wherein the bottom of trench 110 is left with a remaining oxide layer 130' and a remaining photoresist layer 150'.

Referring to FIG. 1h, the remaining photoresist layer 150' is removed.

Referring to FIG. 1i, another conformal oxide layer 170 is formed on the substrate 100, the sidewall of the trench 110 and the remaining oxide layer 130'. The region 180 includes the remaining oxide layer 130' on the bottom of trench 110 and the portion of the conformal oxide layer 170 on the bottom of trench 110. In specific embodiments, the height of the dual oxide layer structure 180 on the bottom of the trench 110 is about 0.2 $\mu$m to about 0.3 $\mu$m.

The disadvantage of the method of prior art is that when the depth of the trench 110 is very deep in FIG. 1e, especially deeper than 1.0 $\mu$m, vaporization of the solvent of the photoresist 150 in the trench 110 is very difficult. This causes the adhesion between the remaining photoresist layer 150' and the oxide layer 130 to be weak. Then, when performing the BOE treatment in FIG. 1f to FIG. 1g, the BOE etchant will damage the interface 200 between the remaining photoresist layer 150' and the oxide layer 130. The oxide structure at the bottom of trench 110 is also damaged, as illustrated in the FIG. 2.

BRIEF SUMMARY OF THE INVENTION

Embodiments of the present invention are directed to an improved method for forming dual oxide layers at the bottom of a trench of a substrate. Instead of curing the photoresist layer prior to partial etching, the photoresist curing treatment is performed after partial photoresist ashing or etching. This allows the easy vaporization of the solvent of the remaining photoresist in the trench. By performing a curing treatment to completely, or substantially completely, vaporize out the solvent of the remaining photoresist layer in the trench, the method produces a strong interface between the remaining photoresist layer and the first bottom oxide layer. As a result, the damage to the interface between the remaining photoresist layer and the first bottom oxide layer by the BOE etchant is minimized, and improved dual oxide layers can be produced by forming the second bottom oxide layer over the first bottom oxide layer.

In accordance with an aspect of the present invention, a method of forming dual oxide layers at the bottom of a trench comprises providing a substrate having a trench which includes a bottom and a sidewall. A first oxide layer is formed on the sidewall and the bottom of the trench of the substrate. A photoresist layer is formed on the substrate, filling the trench of the substrate. The method further comprises partially etching back the photoresist layer to leave a remaining photoresist layer in the trench. The height of the remaining photoresist layer is lower than the depth of the trench. A curing treatment of the remaining photoresist layer is performed. A portion of the first oxide layer is removed to leave a remaining first oxide layer at the bottom of the trench. The remaining photoresist layer is removed. A second oxide layer is formed on the substrate covering at least the remaining first oxide layer.

In some embodiments, the trench is formed on the substrate by forming a mask oxide layer on the substrate; defining the mask oxide layer to form a patterned mask oxide layer and exposing a partial surface of the substrate to form a window; and using the patterned mask oxide layer as an etching mask to form the trench in the window. The patterned mask oxide layer is removed before forming the second oxide layer. The patterned mask oxide layer and the portion of the first oxide layer are removed to leave a remaining first oxide layer at the bottom of the trench by 10:1 BOE treatment. The mask oxide layer comprises a silicon oxide layer formed by thermal oxidation. The trench is formed in the window by dry etching.

In specific embodiments, an HMDS coating is formed on the surface of the first oxide layer before forming the photoresist layer. A heat treatment is performed on the HMDS coating. The heat treatment may be performed at about 70–150° C. for about 40–100 seconds. The second oxide layer is a conformal oxide layer formed on the remaining first oxide layer, the sidewall of the trench, and the surface of the substrate. The method may further comprise performing a curing treatment on the photoresist layer after the photoresist layer is formed on the substrate filling the trench of the substrate. The first oxide layer comprises a self-aligned contact silicon oxide layer formed by thermal oxidation. The photoresist layer may be partially etched back by $O_2$ plasma ashing. The curing treatment of the remaining photoresist layer may be performed at about 120–200° C. for about 60–100 seconds. The second oxide layer comprises a silicon oxide layer formed by thermal oxidation. Performing the curing treatment of the remaining photoresist layer comprises at least substantially completely vaporizing out solvent of the remaining photoresist layer in the trench.

Another aspect of the present invention is directed to a method of forming dual oxide layers at the bottom of a trench wherein a substrate has a trench which includes a bottom and a sidewall, wherein the trench is formed on the substrate by forming a mask oxide layer on the substrate, defining the mask oxide layer to form a patterned mask oxide layer and exposing a partial surface of the substrate to form a window, and using the patterned mask oxide layer as an etching mask to form the trench in the window; wherein a first oxide layer is formed on the sidewall and the bottom of the trench of the substrate, wherein a photoresist layer fills the trench of the substrate; wherein the patterned mask oxide layer and a part of the first oxide layer are removed to leave a remaining first oxide layer at the bottom of the trench; wherein the photoresist layer is removed; wherein a second oxide layer is formed on the substrate covering at least the remaining first oxide layer. The improvement comprises, prior to removing the patterned mask oxide layer, a part of the first oxide layer, and the photoresist layer, partially etching back the photoresist layer to leave a remaining photoresist layer in the trench and performing a curing treatment of the remaining photoresist layer. The height of the remaining photoresist layer is lower than the depth of the trench.

In some embodiments, the photoresist layer is partially etched back by $O_2$ plasma ashing. The curing treatment of the remaining photoresist layer is performed at about 120–200° C. for about 60–100 seconds. The improvement further comprises performing a curing treatment on the photoresist layer after the photoresist layer is formed on the substrate filling the trench of the substrate.

DETAILED DESCRIPTION OF THE INVENTION

Figure 1A:
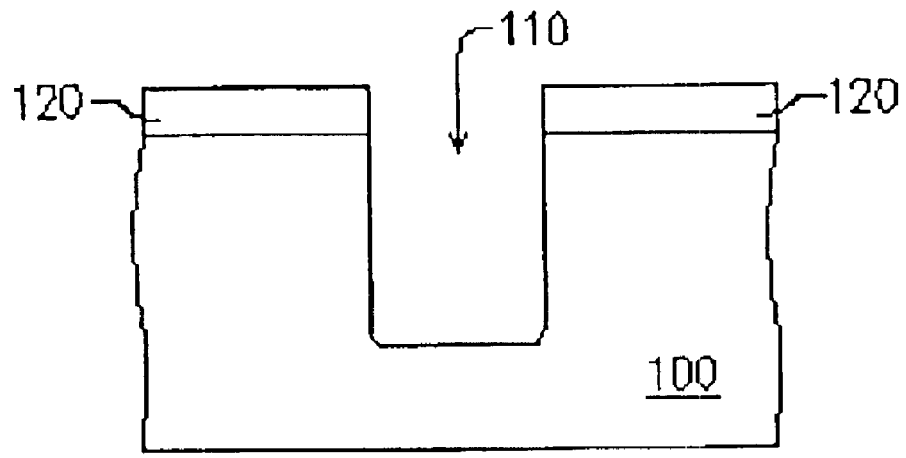
FIGS. 1a–1i show the process sectional diagrams of forming dual oxide layers at the bottom of a trench according to the prior art.
Figure 1B:
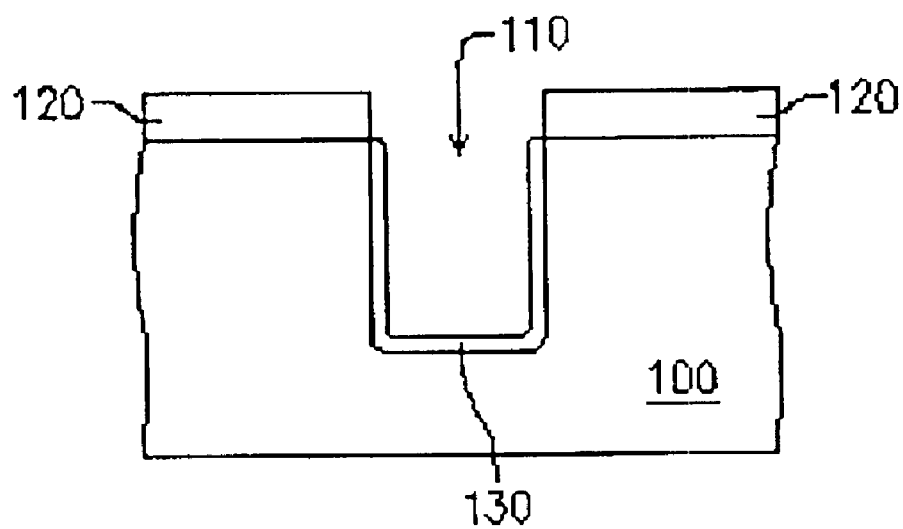
Figure 1C:
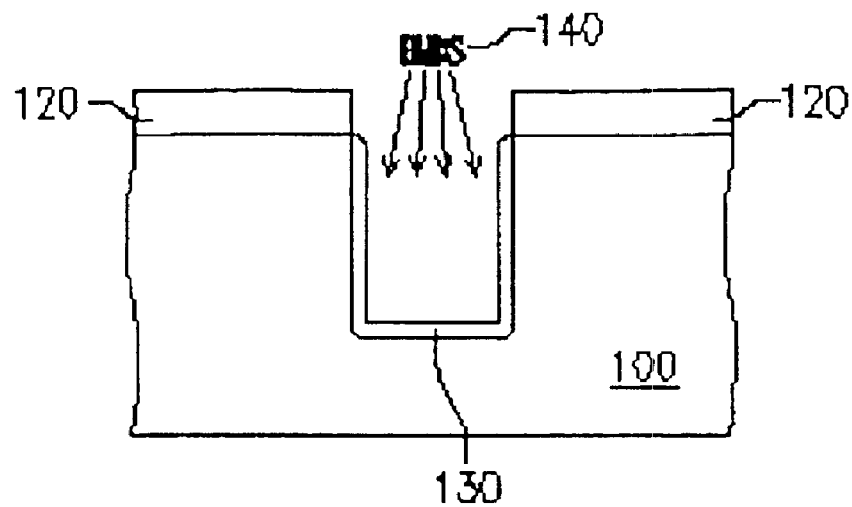
Figure 1D:
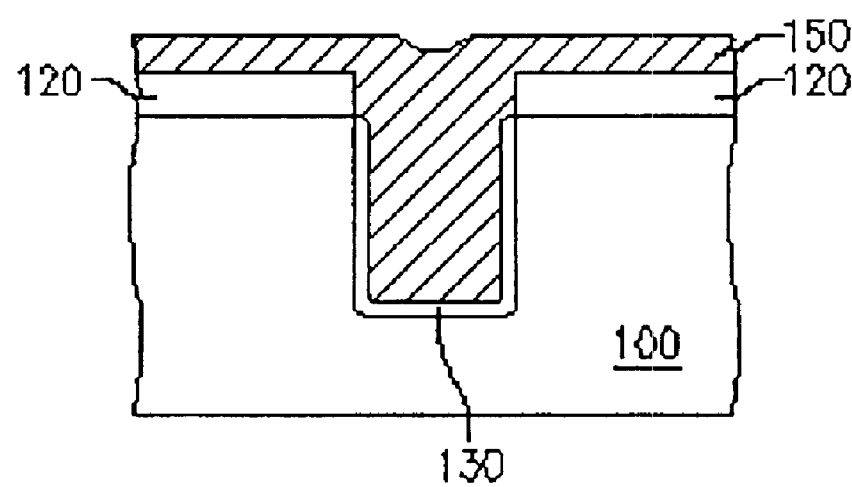
Figure 1E:
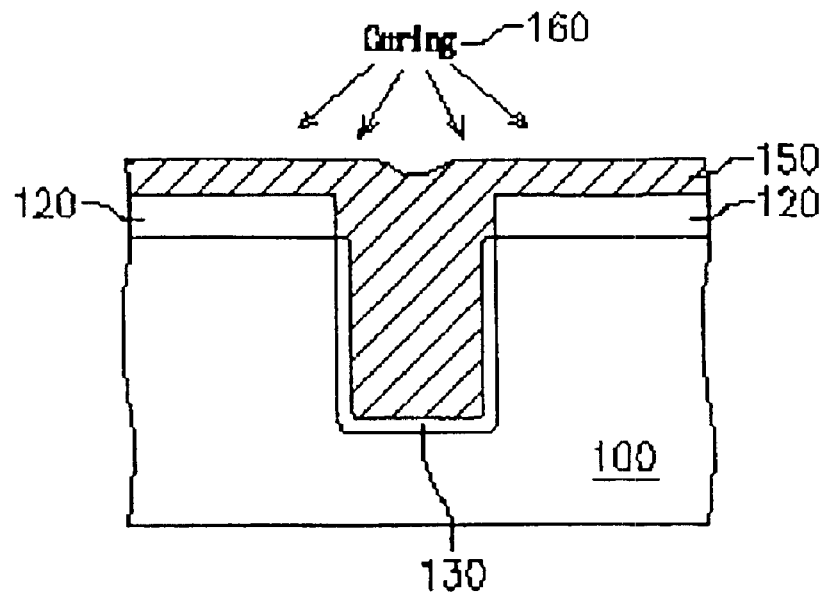
Figure 1F:
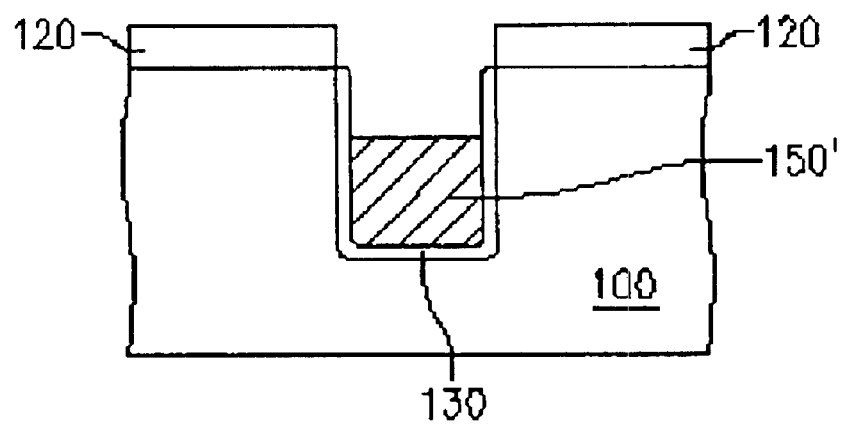
Figure 1G:
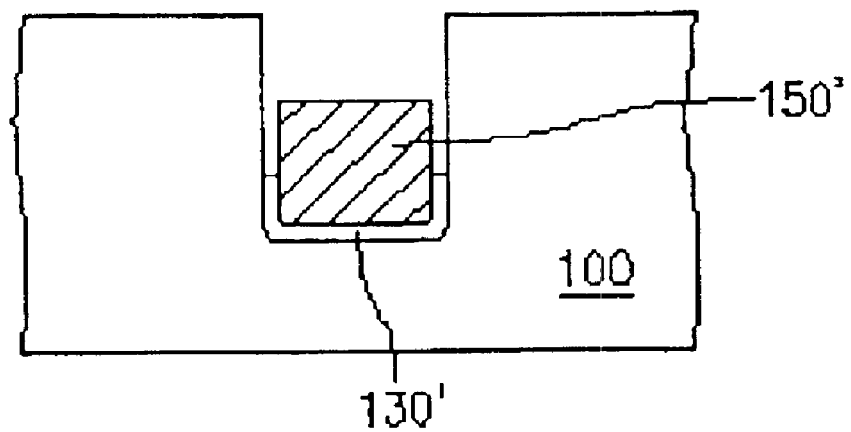
Figure 1H:
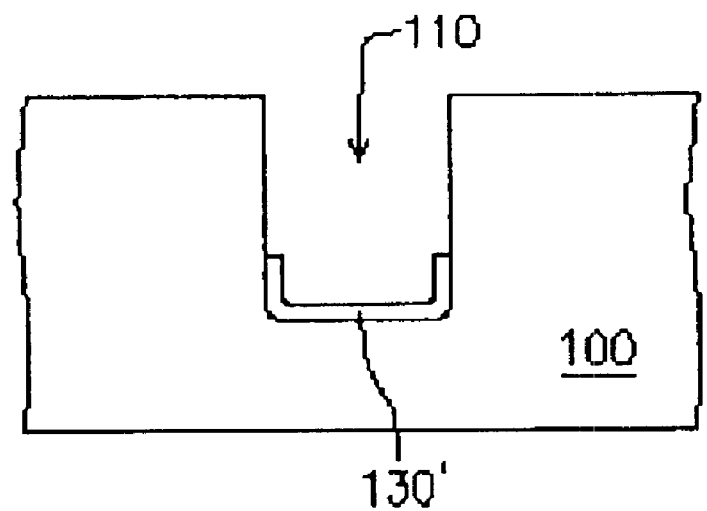
Figure 1I:
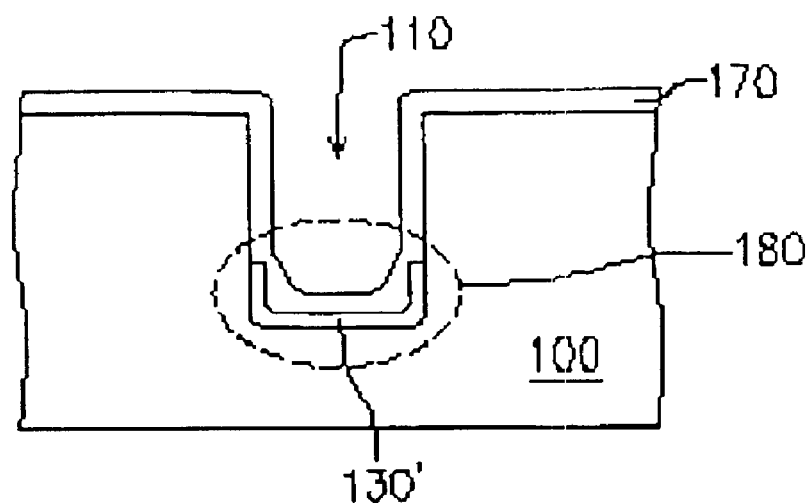
Figure 2:
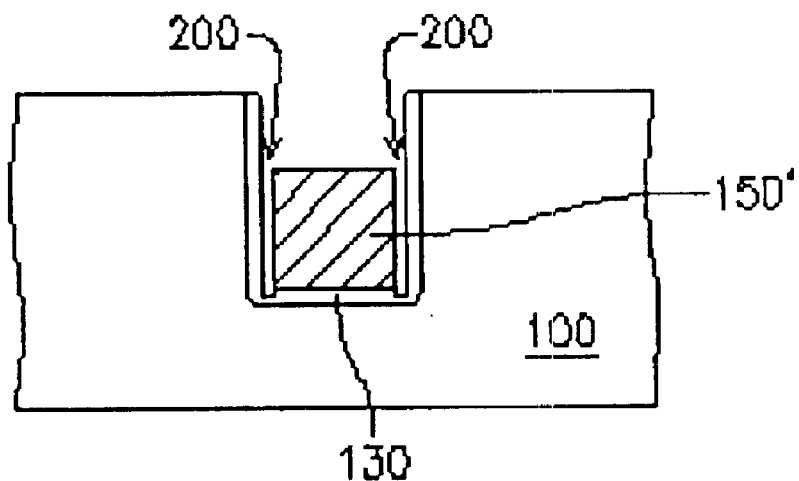
FIG. 2 shows a sectional diagram of the resulting structure formed according to the prior art.
Figure 3A:
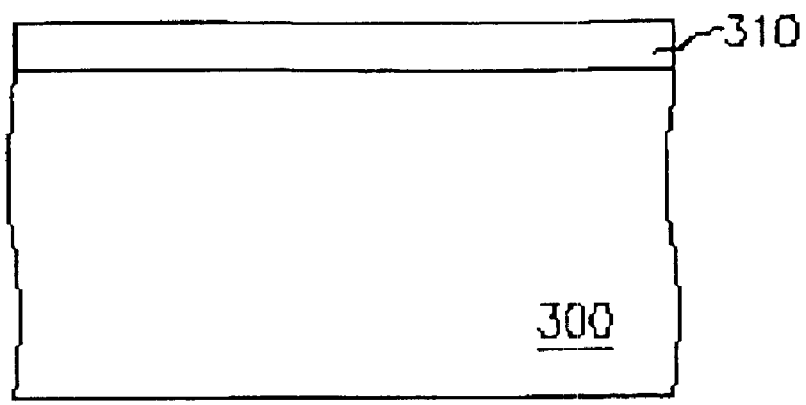
FIGS. 3a–3k show the process sectional diagrams of forming dual oxide layers at the bottom of a trench according to an embodiment of the present invention.

Embodiments of the present invention provide a method for forming dual oxide layers at the bottom of a trench. The method is illustrated in FIGS. 3a–3k. As shown in FIG. 3a, a semiconductive substrate 300 is provided. Then, a mask oxide layer 310 is formed on the substrate 300. The mask oxide layer 310 may be, for example, formed by thermal oxidation.

Figure 3B:
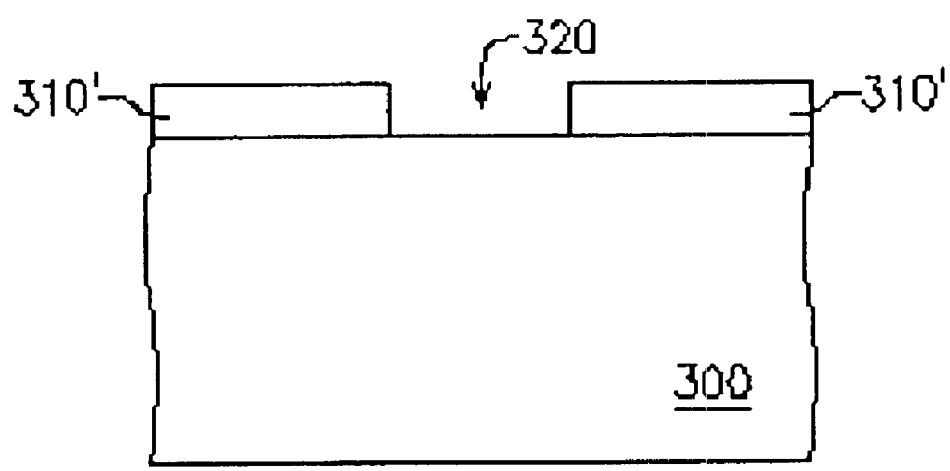

Referring to FIG. 3b, the mask oxide layer 310 is defined to form a patterned mask oxide layer 310'. The mask oxide layer 310' exposes a partial surface of the substrate 300 to form a window 320.

Figure 3C:
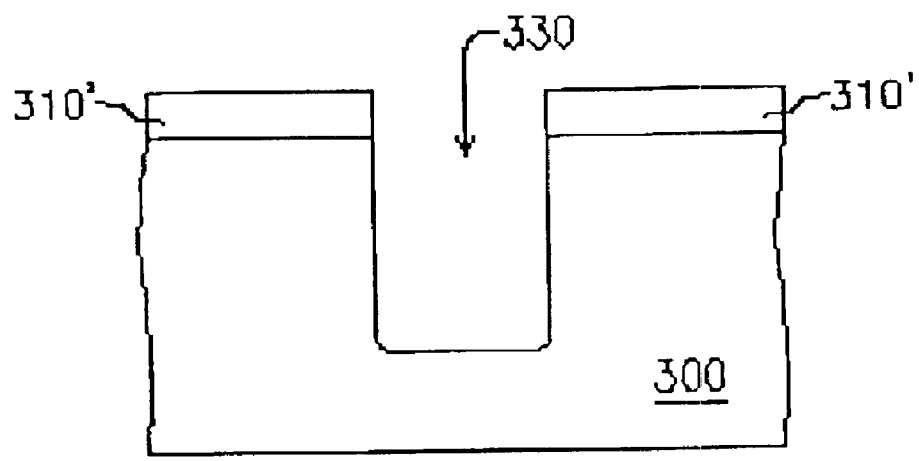

As seen in FIG. 3c, the mask oxide layer 310' is used as an etching mask to form a trench 330 in the window 320. The etching method can be wet etching or dry etching. In specific embodiments, dry etching is preferred because a preferable U-type trench is formed by dry etching.

Figure 3D:
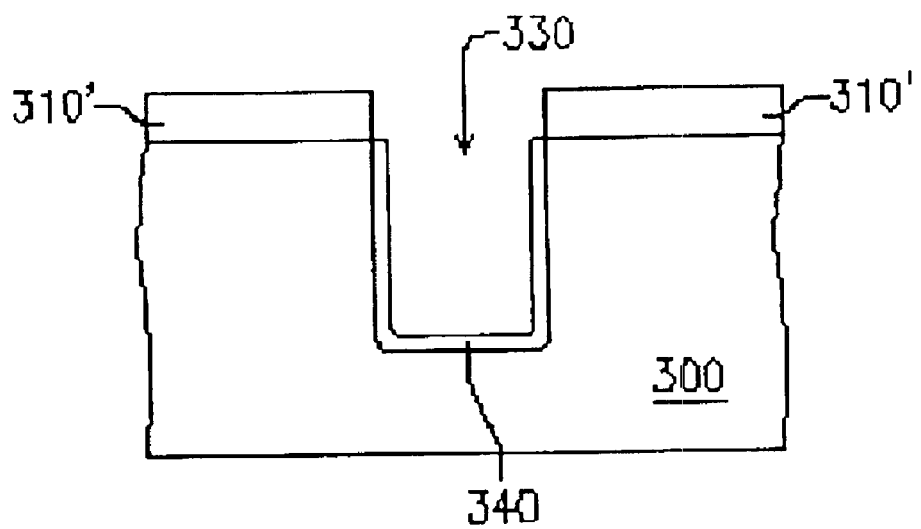

Referring to FIG. 3d, a conformal oxide layer 340 is formed on the sidewall and the bottom of trench 330. The conformal oxide layer 340 is referred to herein as the first oxide layer 340. The first oxide layer 340 may be, for example, a self-aligned contact oxide layer formed by thermal oxidation. In specific examples, the thickness of the first oxide layer 340 is about 1000~1500 Å.

Figure 3E:
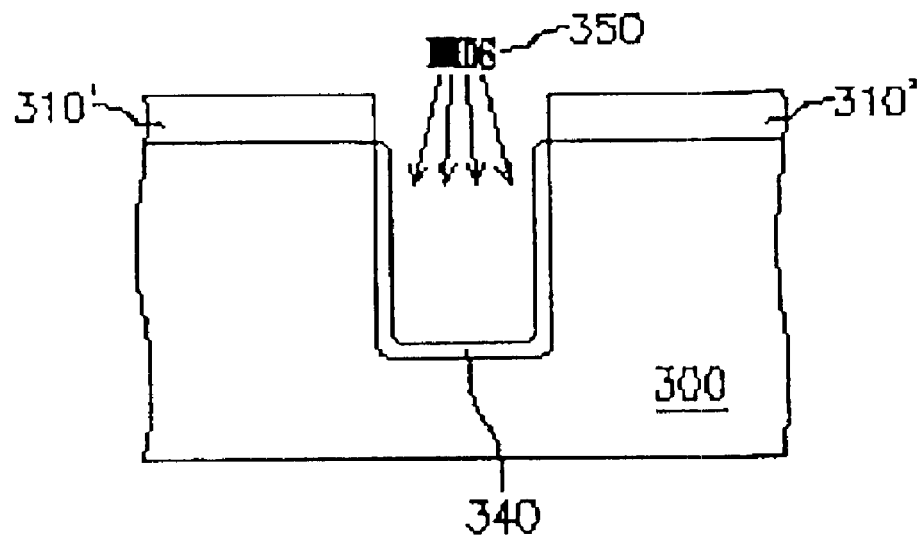

As shown in FIG. 3e, an HMDS coating treatment 350 is performed as a priming treatment, in order to improve the adhesion of photoresist. The HMDS coating treatment 350 further includes a heat treatment, typically under the conditions of about 70~150° C. for about 40~100 sec. Because the thickness of the HMDS coating is very thin, the HMDS coating layer is not shown in FIG. 3e. It is understood that the HMDS coating layer is formed over the first oxide layer 340. Of course, other suitable priming treatments may be used to improve the adhesion of photoresist.

Figure 3F:
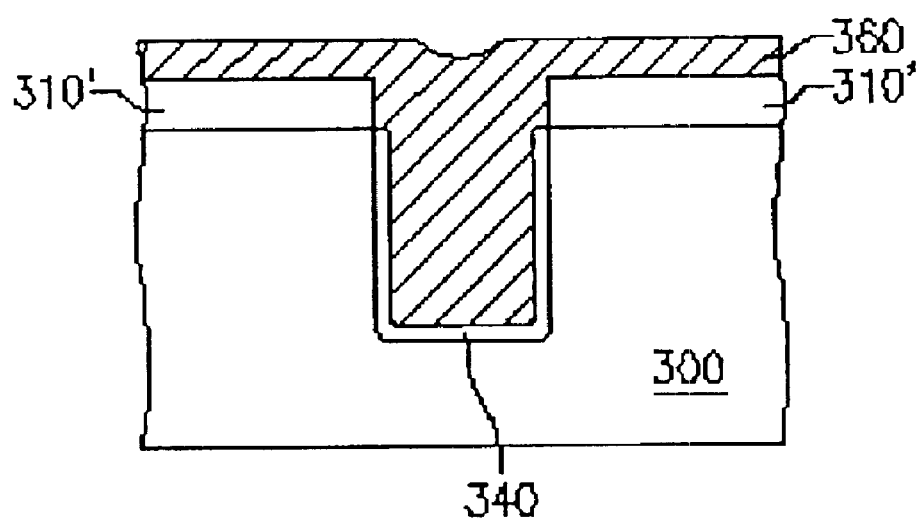

Referring to FIG. 3f, a photoresist layer 360 is formed on the mask oxide layer 310' and the trench 330 is filled up with the photoresist layer 360. A curing treatment could optionally be performed at this point. However, because the trench is deep, the solvent of the photoresist in trench cannot be completely vaporized out in some cases.

Figure 3G:
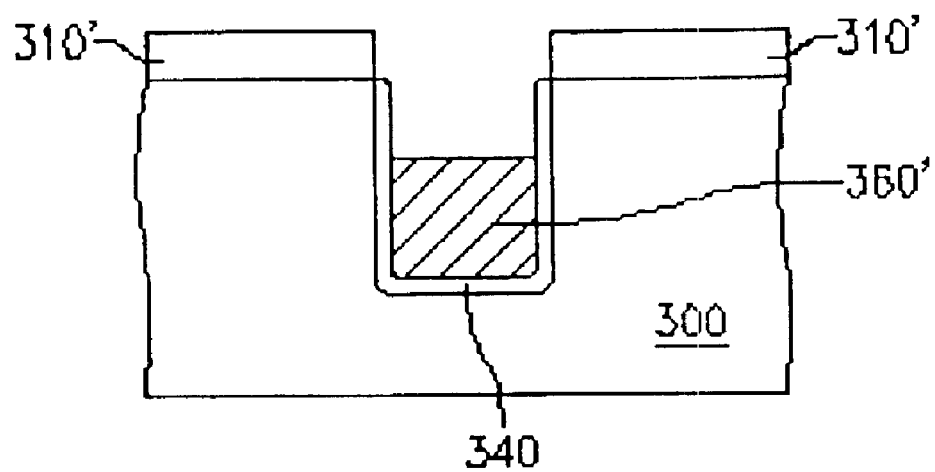

Referring to FIG. 3g, the photoresist layer 360 is partially etched back to leave a remaining photo-resist layer 360' in the trench 330, wherein the height of the remaining photoresist layer 360' is lower than the depth of the trench 330. The partial etching method may be, for example, an $O_2$ plasma ashing method.

Figure 3H:
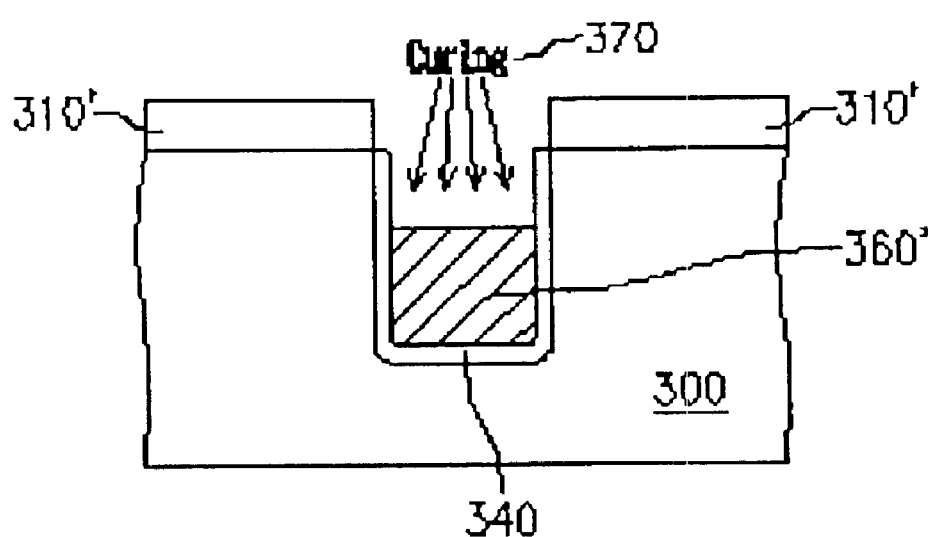

Referring to FIG. 3h, a curing treatment 370 is performed to completely, or substantially completely, vaporize out the solvent of the remaining photoresist layer 360' in the trench 330. For example, it is desirable to vaporize out at least about 90%, more desirably at least about 95%, and most desirably about 100%, of the solvent of the remaining photoresist layer 360' in the trench 330. This improves the adhesion strength between the remaining photoresist layer 360' and the first oxide layer 340. The curing treatment 370, which may be a UV curing, is performed typically under the conditions of about 120~200° C. for about 60~100 sec. Of course, other types of suitable curing treatment may be used.

Figure 3I:
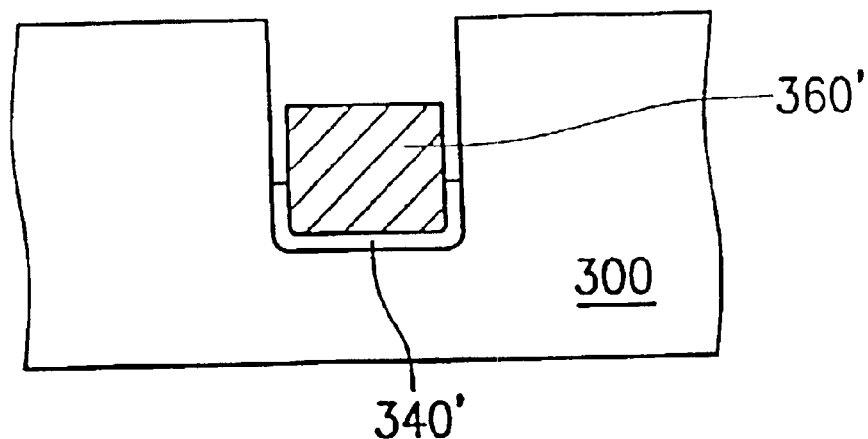

In the example as shown in FIG. 3i, a 10:1 BOE treatment is performed to remove the mask oxide layer 310' and part of the first oxide layer 340, to leave a remaining first oxide layer 340'.

Figure 3J:
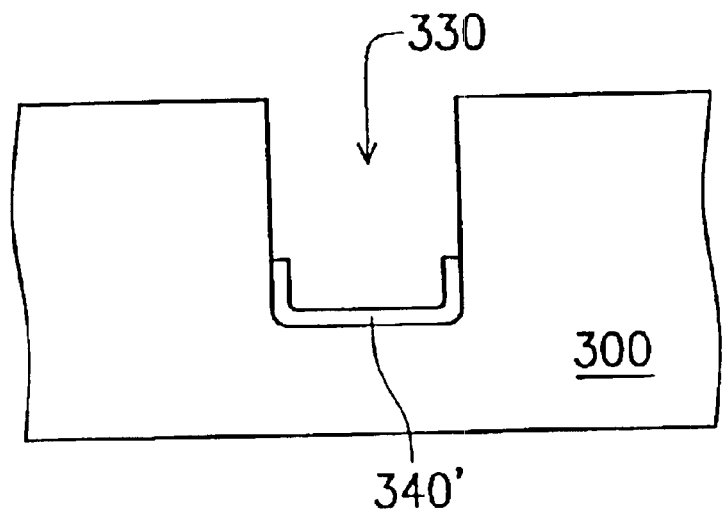

In FIG. 3j, $H_2SO_4$ or another suitable chemical is used to remove the remaining photoresist layer 360'. The remaining first oxide layer 340' has a bowl shape at the bottom of trench 330.

Figure 3K:
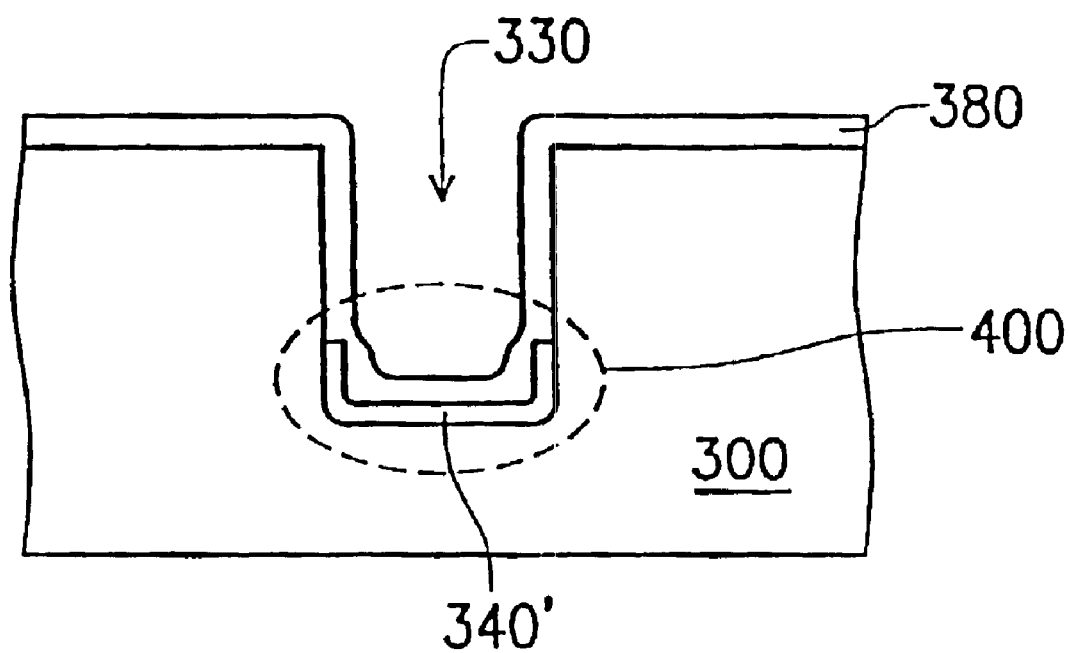

As seen in FIG. 3k, a second conformal oxide layer 380 is formed on the remaining first oxide layer 340' and the sidewall of trench 330, and extends to the surface of substrate 300. As a result, a dual oxide layers structure 400 is formed at the bottom of trench 330. The second oxide layer 380 may be, for example, a silicon oxide layer formed by thermal oxidation. In some embodiments, the thickness of the second oxide layer 380 is typically about 300~1000 Å. The dual oxide layers structure 400 includes the remaining first oxide layer 340' on the bottom of trench 330 and the portion of the second oxide layer 380 on the bottom of trench 330. The height of dual oxide layer structure 400 is typically about 0.05 μm to about 0.5 μm, the height, depending on the body junction depth.

The method according to specific embodiments of the present invention can form dual oxide layers at the bottom of a trench. By performing a curing treatment to completely, or substantially completely, vaporize out the solvent of the remaining photoresist layer 360' in the trench 330, the method produces a strong interface between the remaining photoresist layer 360' and the first oxide layer 340, with the result that a smooth bowl shape oxide structure 340' is formed at the bottom of the trench.

Figure 4:
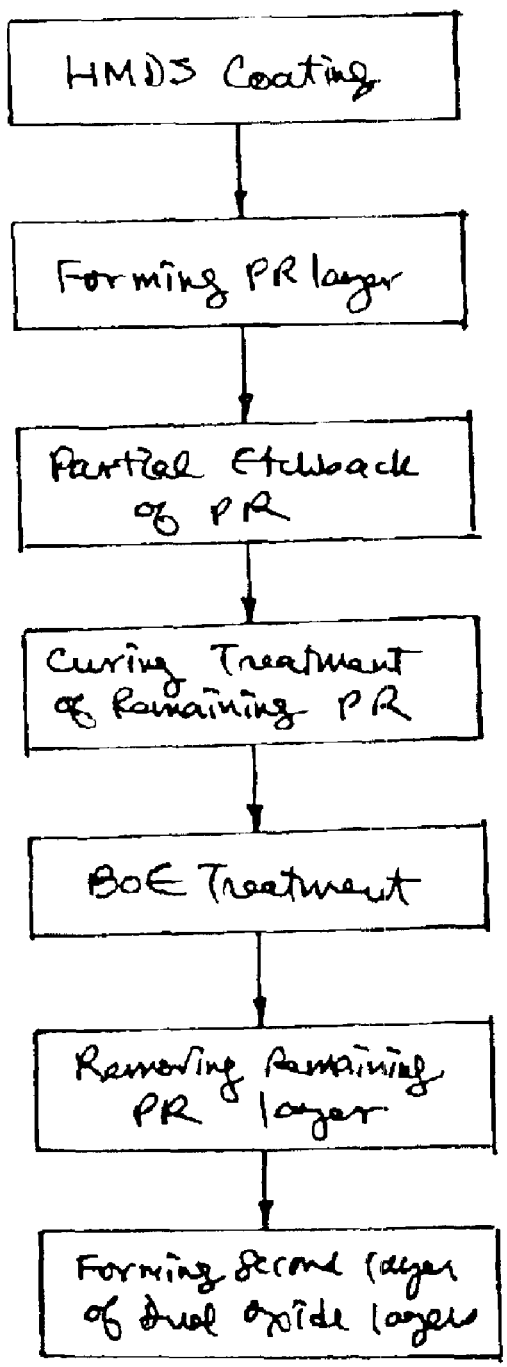
FIG. 4 is a process flow according to an embodiment of the present invention.

FIG. 4 is a process flow of the above-described method according to an embodiment of the present invention. In FIG. 4, the step of PR curing treatment (FIG. 3h) is performed after the step of partial PR ashing or etching (FIG. 3g). This allows the easy vaporization of the solvent of the remaining photoresist in the trench. Therefore, the adhesion strength between the remaining PR layer and the oxide layer is strong, as shown in FIG. 3k.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of forming dual oxide layers at the bottom of a trench, the method comprising:
   providing a substrate having a trench which includes a bottom and a sidewall;
   forming a first oxide layer on the sidewall and the bottom of the trench of the substrate;
   forming a photoresist layer on the substrate, the photoresist layer filling the trench of the substrate;
   partially etching back the photoresist layer to leave a remaining photoresist layer in the trench, the height of the remaining photoresist layer being lower than the depth of the trench;
   performing a curing treatment of the remaining photoresist layer;
   removing a portion of the first oxide layer to leave a remaining first oxide layer at the bottom of the trench;
   removing the remaining photoresist layer; and
   forming a second oxide layer on the substrate covering at least the remaining first oxide layer.

2. The method of claim 1 wherein the trench is formed on the substrate by forming a mask oxide layer on the substrate; defining the mask oxide layer to form a patterned mask oxide layer and exposing a partial surface of the substrate to form a window; and using the patterned mask oxide layer as an etching mask to form the trench in the window.

3. The method of claim 2 wherein the patterned mask oxide layer is removed before forming the second oxide layer.

4. The method of claim 3 wherein the patterned mask oxide layer and the portion of the first oxide layer are removed to leave a remaining first oxide layer at the bottom of the trench by 10:1 BOE treatment.

5. The method of claim 2 wherein the mask oxide layer comprises a silicon oxide layer formed by thermal oxidation.

6. The method of claim 2 wherein the trench is formed in the window by dry etching.

7. The method of claim 1 further comprising forming an HMDS coating on the surface of the first oxide layer before forming the photoresist layer.

8. The method of claim 7 wherein a heat treatment is performed on the HMDS coating.

9. The method of claim 8 wherein the heat treatment is performed at about 70–150° C. for about 40–100 seconds.

10. The method of claim 1 wherein the second oxide layer is a conformal oxide layer formed on the remaining first oxide layer, the sidewall of the trench, and the surface of the substrate.

11. The method of claim 1 further comprising performing a curing treatment on the photoresist layer after the photoresist layer is formed on the substrate filling the trench of the substrate.

12. The method of claim 1 wherein the first oxide layer comprises a self-aligned contact silicon oxide layer formed by thermal oxidation.

13. The method of claim 1 wherein the photoresist layer is partially etched back by $O_2$ plasma ashing.

14. The method of claim 1 wherein the curing treatment of the remaining photoresist layer is performed at about 120–200° C. for about 60–100 seconds.

15. The method of claim 1 wherein the second oxide layer comprises a silicon oxide layer formed by thermal oxidation.

16. The method of claim 1 wherein performing the curing treatment of the remaining photoresist layer comprises at least substantially completely vaporizing out solvent of the remaining photoresist layer in the trench.

17. In a method of forming dual oxide layers at the bottom of a trench wherein a substrate has a trench which includes a bottom and a sidewall; wherein the trench is formed on the substrate by forming a mask oxide layer on the substrate, defining the mask oxide layer to form a patterned mask oxide layer and exposing a partial surface of the substrate to form a window, and using the patterned mask oxide layer as an etching mask to form the trench in the window; wherein a first oxide layer is formed on the sidewall and the bottom of the trench of the substrate, wherein a photoresist layer fills the trench of the substrate; wherein the patterned mask oxide layer and a part of the first oxide layer are removed to leave a remaining first oxide layer at the bottom of the trench; wherein the photoresist layer is removed; wherein a second oxide layer is formed on the substrate covering at least the remaining first oxide layer; wherein the improvement comprises, prior to removing the patterned mask oxide layer, a part of the first oxide layer, and the photoresist layer:
   partially etching back the photoresist layer to leave a remaining photoresist layer in the trench, the height of the remaining photoresist layer being lower than the depth of the trench; and
   performing a curing treatment of the remaining photoresist layer.

18. The method of claim 17 wherein the photoresist layer is partially etched back by $O_2$ plasma ashing.

19. The method of claim 17 wherein the improvement further comprises performing a curing treatment on the photoresist layer after the photoresist layer is formed on the substrate filling the trench of the substrate.

20. A method of forming dual oxide layers at the bottom of a trench, the method comprising:
   providing a substrate;
   forming a mask oxide layer on the substrate;
   defining the mask oxide layer to form a patterned mask oxide layer and exposing a partial surface of the substrate to form a window;
   using the patterned mask oxide layer as an etching mask to form the trench in the window;
   forming a first oxide layer on a sidewall and a bottom of the trench of the substrate;

forming a photoresist layer on the substrate, the photoresist layer filling the trench of the substrate;

partially etching back the photoresist layer to leave a remaining photoresist layer in the trench, the height of the remaining photoresist layer being lower than the depth of the trench;

performing a curing treatment of the remaining photoresist layer;

removing the patterned mask oxide layer and a portion of the first oxide layer to leave a remaining first oxide layer at the bottom of the trench;

removing the remaining photoresist layer; and forming a second oxide layer on the substrate covering at least the remaining first oxide layer.

* * * * *